United States Patent
Kumar et al.

(12) 
(10) Patent No.: US 6,709,749 B1
(45) Date of Patent: *Mar. 23, 2004

(54) METHOD FOR THE REDUCTION OF LATERAL SHRINKAGE IN MULTILAYER CIRCUIT BOARDS ON A SUBSTRATE

(75) Inventors: Ananda Hosakere Kumar, Plainsboro, NJ (US); Barry Jay Thaler, Lawrenceville, NJ (US); Ashok Narayan Prabhu, East Windsor, NJ (US)

(73) Assignee: Lamina Ceramics, Inc., Westampton, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/146,478

(22) Filed: Sep. 3, 1998

Related U.S. Application Data

(62) Division of application No. 08/780,243, filed on Jan. 8, 1997, now Pat. No. 5,876,536, which is a continuation of application No. 08/467,351, filed on Jun. 6, 1995, now abandoned.

(51) Int. Cl.$^7$ .............................. B32B 18/00; B32B 3/00
(52) U.S. Cl. ....................... 428/432; 428/210; 428/469; 156/89.11
(58) Field of Search .......................... 156/89.11, 89.12, 156/252, 268; 428/210, 901, 469, 432; 174/250, 255

(56) References Cited

U.S. PATENT DOCUMENTS

| | | | |
|---|---|---|---|
| 4,920,640 A | 5/1990 | Enloe et al. | 29/852 |
| 5,073,180 A | 12/1991 | Farooq et al. | 65/18.4 |
| 5,085,720 A | 2/1992 | Mikeska et al. | 156/89 |
| 5,130,067 A | 7/1992 | Flaitz et al. | 264/60 |
| 5,254,191 A | 10/1993 | Mikeska et al. | 156/89 |
| 5,277,724 A | 1/1994 | Prabhu | 156/89 |
| 5,302,219 A | 4/1994 | Hargis | 156/89 |
| 5,370,759 A | 12/1994 | Hakotani et al. | 156/73.1 |
| 5,456,778 A | 10/1995 | Fukuta et al. | 156/89 |
| 5,470,412 A * | 11/1995 | Fukuta et al. | |
| 5,490,965 A | 2/1996 | Christiansen | 264/234 |
| 5,525,402 A * | 6/1996 | Nakamura et al. | |
| 5,814,366 A * | 9/1998 | Fukuta et al. | |
| 5,855,711 A * | 1/1999 | Araki et al. | |
| 5,858,145 A * | 1/1999 | Sreeram et al. | 156/89.16 |
| 5,876,536 A * | 3/1999 | Kumar et al. | 156/89.11 |

* cited by examiner

*Primary Examiner*—Curtis Mayes
(74) *Attorney, Agent, or Firm*—Birgit E. Morris

(57) ABSTRACT

A method of controlling shrinkage in aligned green tape stacks during firing comprises providing a topmost layer of a ceramic material having a sintering temperature higher than that of the ceramic used to make the green tapes and firing above the sintering temperature of the green tape ceramic but below the sintering temperature of the topmost layer ceramic. The method of the invention provides improved shrinkage control for green tape stacks on a support substrate.

2 Claims, 2 Drawing Sheets

METHOD FOR THE REDUCTION OF LATERAL SHRINKAGE IN MULTILAYER CIRCUIT BOARDS ON A SUBSTRATE

This application is a Divisional of U.S. application Ser. No. 08/780,243 filed Jan. 8, 1997, now U.S. Pat. No. 5,876,536, which is a Continuation of U.S. application Ser. No. 08/467,351, now abandoned.

This invention relates to a method for dimensional control during firing of multilayer circuit boards. More particularly, this invention relates to a method of controlling the dimensions of patterned supported multilayer circuit boards during firing.

BACKGROUND OF THE INVENTION

Ceramic multilayer printed circuit boards have been used for many years for circuits for electrical apparatus, such as mainframe computers. Such printed circuit boards are made by casting glass and/or ceramic powders together with an organic binder into tapes, called green tapes. A conductive metal circuit can be patterned onto the green tape by screen printing for example. Vias are formed in each green tape that are then filled with conductive materials, called via inks, to connect the circuits of the various layers electrically. The green tape layers are then stacked and aligned, pressed together under pressure, and fired to burn off organic residues and sinter the glass, thereby forming a fired ceramic multilayer circuit board.

Originally ceramics such as alumina were used to form the green tape layers, but these ceramics require high firing temperatures, up to 1500° C. This necessitates the use of high melting, refractory conductor metals, such as tungsten or molybdenum, to form the circuit patterns because they can withstand these high firing temperatures. More recently, devitrifying glasses have been used to form the green tapes that can be fired at temperatures of 1000° C. or less. Multilayer circuit boards made of these glasses can be used with lower melting, more conductive metals, such as silver, gold and copper. However, these glass-based printed circuit boards have the disadvantage that they are not as strong as alumina circuit boards.

Thus even more recently, low firing temperature glasses have been deposited on support substrates made of metal or ceramic to which the glasses will adhere. The support substrate can be made of thermally conductive materials such as nickel, Kovar, Invar, or composites of Kovar or Invar coated with copper for increased conductivity, as well as thermally conductive ceramics such as aluminum nitride, silicon carbide, diamond and the like. These substrates impart added strength to the composite. A bonding glass, such as described in U.S. Pat. No. 5,277,724 to Prabhu, can be used to improve adhesion of the green tape layers to the support substrate. In addition, if chosen correctly, the bonding glass can reduce shrinkage of the green tape with respect to the support substrate in at least the two lateral, x and y, dimensions, and thus all of the shrinkage of the green tape layers during firing occurs in the thickness, or z dimension, only. This in turn reduces problems of alignment of the circuit patterns in the glass layers and alignment of the circuit patterns to the via holes in the support substrate.

Active devices can also be mounted onto the planar surfaces of the fired glass. When it is desired to place active devices into cavities in the fired glass circuit boards, they have been made heretofore by hot pressing a cavity into the green tape using a shaped die and punch assembly. However, during the firing process, the green tapes shrink, not always controllably. When the green tape is laminated, the lamination pressure plastically deforms the resin in the green tape, causing the cavity walls to flow inwardly, with the result that the cavity is smaller than the punch used to make the cavity cutouts. The shrinkage that occurs during firing of the green tape further contributes to misalignment problems and cavity size problems. These problems are reduced when a support substrate is used because shrinkage is controlled in two, x and y, dimensions. However, there is still some residual shrinkage in these two dimensions, up to about 3%, and thus problems of process control and shrinkage have continued.

Thus improved methods of controlling cavity dimensions during the lamination and sintering of supported multilayer glass substrates would be highly desirable.

SUMMARY OF THE INVENTION

We have found that by adding a top layer of an inert ceramic material powder, one that does not sinter at the temperatures used for firing the multilayer green tape laminate, mixed with a high proportion of the resin binder employed for the green tape, shrinkage in the lateral dimensions of the green tape laminate is reduced.

This top layer is particularly useful when it is desired to form cavities in the fired glass circuit board into which devices are to be inserted.

To further improve the control of shrinkage for cavities after formation of the cavity in the green tape stack, the cavity can be filled with the inert ceramic green tape material which maintains the dimensional stability of the cavity during subsequent firing.

The inert ceramic green tape material can also be used to maintain dimensional control of ceramic projections from a green tape surface. Glass/ceramic projections are made from the same glass as used to make the green tapes. These projections are formed by punching openings through a layer of the inert ceramic-binder composition, and filling the spaces with glass green tape material. Upon firing, the glass projections adhere to the fired glass or green tape material, and the surrounding inert ceramic green tape material ensures that dimensional stability of the projections are maintained.

DETAILED DESCRIPTION OF THE INVENTION

During lamination of a green tape stack, a platen press is used to press the green tape layers together to form a monolithic green body. The platen press is operated at temperatures of about 90–100° F. and pressures of 500–4000 psi.

The pressure exerted by the platen press has both vertical and shear components. The vertical component helps to fuse the various green tape layers into a single green body. The shear component however causes lateral plastic flow of the resin-filled green tape, and is responsible for deformation of cavity walls for example. Thus in accordance with the present invention, a top layer of an inert ceramic material, admixed with a high proportion of a resin binder, e.g., about 40 percent by weight as compared to the standard 25 percent by weight of conventional green tape compositions, is deposited onto the green tape laminate prior to firing. Although the exact reason for the improved results obtained in accordance with the invention are not known with certainty, it is believed the presence of the higher resin content in the top, non-sintering inert layer compared to the rest of the green tape layers, limits the shear deformation of cavity walls in the green tape layers, and therefore improves control of the cavity size during lamination.

During firing of the green tape layers, the inert ceramic particles in the top inert layer temporarily become embedded in the top surface of the main ceramic body. By choosing the ceramic particles on the top layer tape so they do not sinter at the temperature when the glass of the main laminate layers sinters, these particles restrain the lateral shrinkage of the main ceramic laminate, and force the laminate to shrink in the vertical dimension alone. This eliminates the small but troublesome shrinkage that is known to occur in the laminate during firing. The inert ceramic particles can be readily removed after firing, as by brushing or washing them away.

Suitable ceramic powders for use in the present invention include one or more of alumina, magnesia, quartz, boron nitride and the like. The ceramic powders can be non-reactive with the ceramics and glasses used to form the green tapes, but they can also interact with the green tape ceramics. This interaction can impart surface properties that can be beneficial. For example, a reactive layer having a thermal coefficient of expansion that is lower than that of the ceramic used in the green tape laminate will increase the strength of the substrate, due to compressive stress that results in the green tape surface. A reactive layer can also impart an improved surface finish to the multilayer substrate.

Figure 1A:
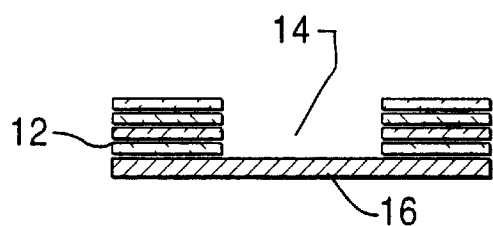
FIGS. 1A, 1B and 1C illustrate the changes in dimensions of cavities in prior art green tape laminates during lamination and firing.
Figure 1B:
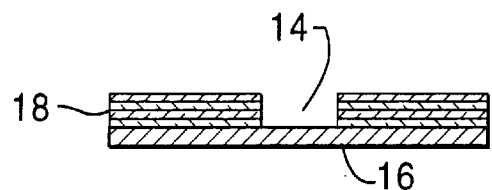
Figure 1C:
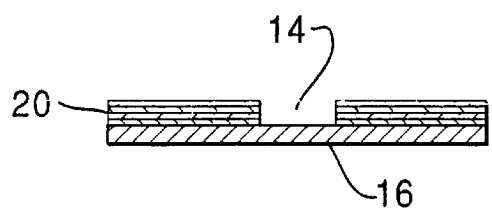

The invention can be further explained with reference to the Drawing, wherein FIGS. 1A to 1C illustrate firing of a conventional green tape laminate having a cavity formed therein on a substrate support; and FIGS. 2A to 2D illustrate the firing of a green tape laminate having a cavity formed therein on a support substrate and additionally having a top, non-sinterable inert ceramic layer thereover in accordance with the present invention.

Referring to FIG. 1A, a green tape stack 12 having a cavity 14 formed therein is mounted on a support substrate 16. The stacked green tapes are then laminated in a press at a temperature of about 90° F. and a pressure of about 1500 psi to form the laminate 18 of FIG. 1B. It is apparent that the size of the cavity 14 has been made smaller during the compression of the green tape stack 12.

The above laminate is then fired, generally at a temperature up to about 1000° C. The resultant fired glass layer 20 has shrunk only in the vertical direction, and the edges of the fired ceramic layer 20 adjacent to the cavity 14 are slightly rounded. The fired cavity has now increased in size due to the pulling away of the sintered glass from the center of the cavity. Thus it is apparent that the size of the cavity changes both after lamination and after firing, often in an uncontrollable way, in accordance with prior art methods of lamination and firing of the green stack tapes on supported substrates.

Figure 2A:
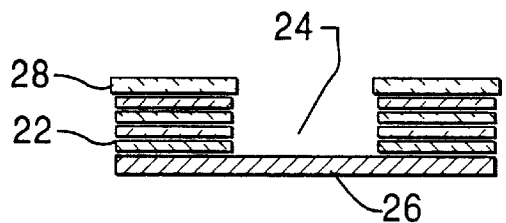
FIGS. 2A, 2B, 2C and 2D illustrate the changes in dimensions of cavities in green tape laminates of the invention during lamination and firing.

Referring now to FIG. 2, FIG. 2A illustrates a green tape layer stack 22 having a cavity 24 formed therein. The green tape layer stack 22 is supported by a substrate support 26 and has a top layer 28 of a non-sintering ceramic material.

Figure 2B:
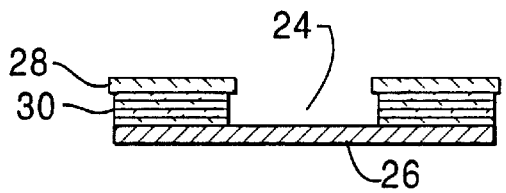

After laminating the green stack 30, as shown in FIG. 2B, the cavity 24 is about the same size as in FIG. 2A, the layer 28 having prevented shrinkage of the cavity 24 during compression. The layer 28 also slightly overhangs the laminated green stack 30.

Figure 2C:
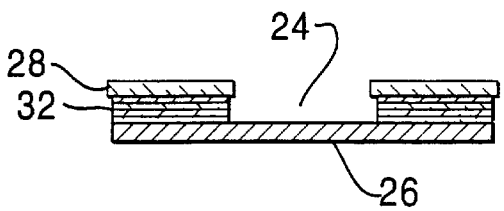

After firing the laminate stack, as shown in FIG. 2C, the sintered layers 32 have shrunk only in the thickness dimension, and the top layer 28 remains intact, still slightly overhanging the fired stack 32. The layer 28 now comprises the powdered ceramic, the resin having been removed during firing. The cavity 24 has straight walls, and is about the same dimensions as the original cavity.

Figure 2D:
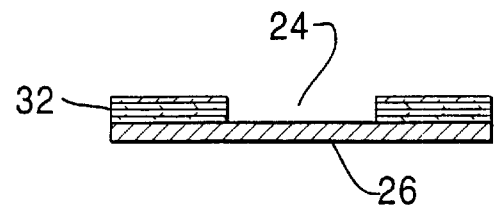

FIG. 2D shows the fired green tape stack after removal of the top ceramic layer. The fired stack 32 having a cavity 24 is adhered to the substrate 26.

A green tape composition is generally made from a devitrifying glass powder having a sintering temperature of about 900° C. by ball milling with a conventional organic binder system. Such binders are well known and generally include a binder, such as polyvinyl butyral, and a plasticizer, such as dioctylphthalate or dibutyl phthalate. An organic solvent, such as methanol and the like, helps dissolve the binder so the binder coats the glass particles uniformly, and helps to adjust the rheology of the slip or slurry for good castability.

The above slurry is cast or doctor bladed onto a polyethylene terephthalate sheet and dried. The slurry contains about 75% by volume of glass powder and about 25% by volume of the binder slurry.

In accordance with the invention, an inert ceramic tape is made from alumina powder for example, which has a sintering temperature in excess of 1600° C., using the same binder composition, except using 40% by weight of the binder. The high binder resin content of this inert ceramic green tape composition causes this layer to deform during the lamination step more than the glass green tape layers.

In an alternate embodiment of the invention, after forming the green tape stack having the inert ceramic layer of the invention thereon, and forming the desired cavities in the layer, the cavity can be filled with the same binder-ceramic composition used to make the inert green tape composition.

Figure 3A:
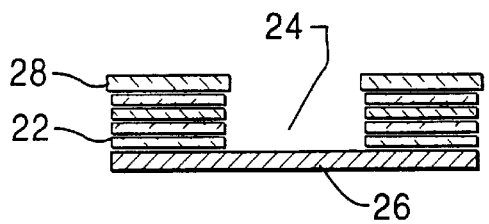
FIGS. 3A, 3B, 3C and 3D illustrate another embodiment of the invention wherein cavities are filled prior to firing.

This embodiment is shown in FIGS. 3A to 3D. FIG. 3A illustrates a stacked green tape layer 22 on a substrate 26 having an inert ceramic layer 28 thereover, and a cavity 24 formed therein, as shown in FIG. 2A. The cavity 24 is then filled with a preformed cavity plug 34 having the same composition as that of the inert green tape layer.

Figure 3B:
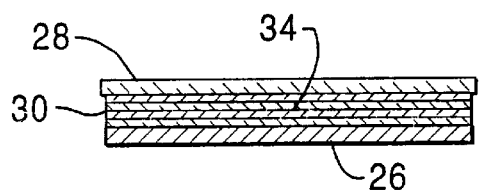
Figure 4B:
Figure 3C:
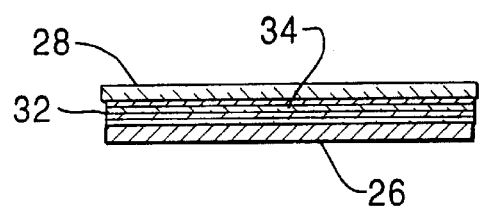
Figure 4C:
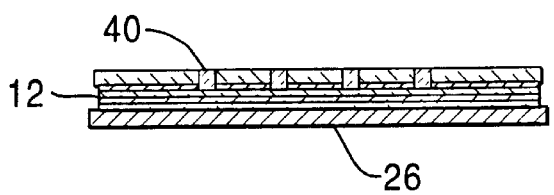
Figure 3D:
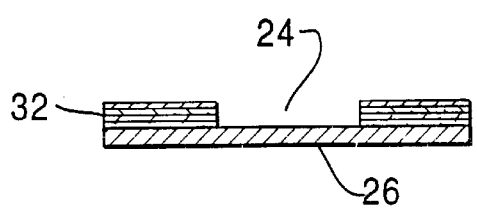

The cavity plugs 34 can be employed as punched, or the plugs can be pre-laminated using a lower pressure than that used for lamination of the green tape stack, before placing the preforms in the cavities 22. The plugs 34 are made with the same punch as that used to form the cavities, and are thus of similar size. The plugs 34 are dropped into the cavities 24 and the whole is laminated as set forth hereinabove, as shown in FIG. 3B. The laminate is then fired, producing the fired ceramic of FIG. 3C. The top ceramic layer 28 and the plugs 34 are removed, leaving a cavity 34 having improved dimensional stability, as seen in FIG. 3D.

In still another embodiment of the invention, projections such as posts are formed that extend from the fired ceramic multilayer stack. For example, if a planar surface, such as a glass panel, is to be supported by the projections or posts, each of the projections must be of the exact same height to prevent wobbling of the planar panel and to provide uniform support for the panel.

After forming the green tape stack with the inert ceramic layer of the invention thereon as described hereinabove, desired cavities are formed in the inert ceramic layer. A plurality of these inert layers may be used and aligned so that the cavities or openings are the depth of the projections sought to be made. These cavities or openings are filled with the green tape composition used to make the multilayer ceramic stack. Thus ceramic projections are formed surrounded by the inert ceramic tape composition, which will maintain the desired size and shape of the projections during the subsequent firing step.

Figure 4A:
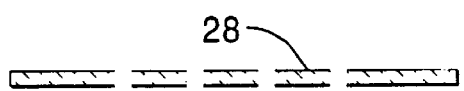
FIGS. 4A, 4B, 4C and 4D illustrate another embodiment of the invention wherein dimensionally controlled projections are formed above supported fired glass structures.

This embodiment is shown in FIGS. 4A to 4D. As shown in FIG. 4A, an inert tape layer 28 is punched to provide a plurality of openings and, as shown in FIG. 2B, the openings are filled with the glass ceramic slurry used to make the green tape layers by screen printing. This step forms a plurality of green tape posts 40 supported and surrounded by the inert ceramic-binder composition 28.

Figure 4D:
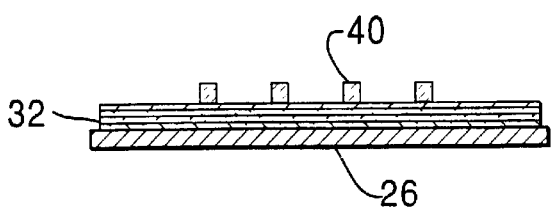

A plurality of the resultant tapes of FIG. 2B, including the glass posts 40, can-be aligned and laminated onto a green tape stack 12 to build the posts 40 to the desired height. The composite stacks are placed on a support substrate 26, as shown in FIG. 4D. The composite stack is then fired as above. The firing serves to sinter the glass posts 40 to the top glass ceramic layer 12.

The inert ceramic powder remaining between the posts 40 after firing is then removed, as by brushing or washing away the inert ceramic powder, thus providing a plurality of glass ceramic posts 40 adhered to the fired glass stack. These posts 40 have straight walls and the desired dimensions.

Figure 5:
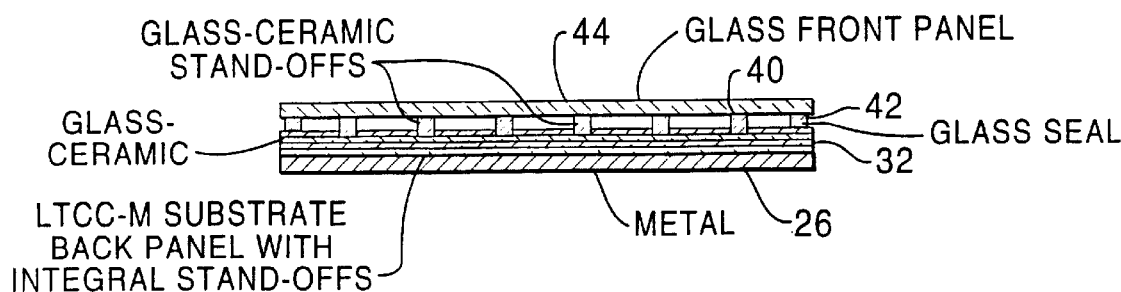
FIG. 5 is a cross sectional view of a glass panel supported by projections from a supported multilayer circuit board.

The above method can be used to form a flat panel display for example, as shown in FIG. 5. The metal substrate 26 has a glass ceramic circuit structure 32 thereon, as described above. A plurality of glass ceramic posts 40 are affixed thereto by the above process, and a glass panel can be supported or sealed by means of glass seals 42 to the glass ceramic circuit structure. The posts 40, which have a uniform shape and size and have straight walls, provide a uniform spacing between the glass panel and the circuit structure, and support for the glass panel.

The invention will be further described in the following Control and Example, but the invention is not meant to be limited to the details described therein.

Control

Six glass green tape layers having a square cavity punched therein, the cavity being 0.187 inch square, were stacked together and aligned so that the square cutouts were in registration with each other. The aligned green tape stack was placed on a nickel plated oxidized and glazed copper-molybdenum-copper plate 0.020 inch thick and laminated thereto in a press at 90° F. under pressure of 1500 psi.

After pressing, the cavity size was reduced to 0.145 inch square, and the laminate layer thickness was reduced.

The green tape laminate was then fired to 900° C. to remove the organics and sinter the glass. After firing, the cavity size was 0.172 inch, significantly smaller than the original cutout size.

EXAMPLE 1

Six green tape layers as in the Control and one alumina tape layer as described above, all having 0.187 inch square cutouts punched therein, were stacked so the alumina tape layer was on the top. The layers were aligned and laminated onto a substrate as in the Control. The alumina tape layer had deformed more than the glass green tape layers, forming an overhang. The cavity dimensions of the underlying glass green tape layers were 0.180 inch, comparatively little changed from their original size.

After firing the laminate at 900° C., the alumina layer, which was now powdered but still overhung the fired ceramic layers beneath, maintained their dimensions. The alumina powder was washed away with a stream of water. The cavity dimension was 0.182 inch square, very little changed from the original cutout dimensions.

Thus the presence of a non-sinterable ceramic layer over the green tape laminate ensures good dimensional stability of the green tapes during firing, and of cavities punched into the green tapes.

EXAMPLE 2

Following the procedure of Example 1, six green tape layers and an alumina tape layer were prepared, and 0.187 inch square cavities were punched therein. The resultant stack was placed onto a substrate. The cavity was then filled with six punched plugs of the inert green tape layers made with the same punch that was used to make the cavities.

After lamination as in Example 1, the cavities were measured and found to be 0.185 inch along a side, indicating improved dimensional control over those of Example 1 without the plugs.

After firing the filled cavity laminates at 900° C., and removing the alumina layer and plugs, the cavity size was 0.187 inch per side. Thus the fired cavity was exactly the same size as the original punched cavity.

In addition, we have found that the top non-sinterable layer can also prevent lateral shrinkage in a multilayer green tape stack on a substrate support, whether having punched cutouts or not, that has up to 15 or more layers. Such multiple green tape layer laminates having thicknesses of about 0.060 inch and higher, have shrinkage which is less controllable as the distance between the top of the laminate and the support substrate becomes greater, and the influence of the support substrate against lateral shrinkage becomes less consistent. By employing a top non-sintering layer in conjunction with a substrate support layer, a larger number of green tape layers may be laminated together and fired without significant shrinkage in the lateral dimensions. This top layer can be a green tape layer as described above in Example 1, or the non-sintering green tape slurry can be patterned to surround the top of the green tape laminate, as a band from about 0.05 to 0.5 inch wide for example. In the case where circuit features are present and exposed in the multilayer board, any danger of interaction between the alumina or other non-sinterable material of the top layer and the material of the circuitry will be eliminated using this configuration.

Thus non-sintering green tape layers or patterned green tape layers as a top layer act as a further constraint on lateral shrinkage of green tape laminates, whether containing shaped, punched cavities or not, that further contribute to shrinkage controllability in the lateral dimensions of supported green tape layers.

Although the present invention has been described in terms of particular embodiments, numerous changes can be made to the materials of the layers, their treatment, alignment and firing, as will be known to those skilled in the art. For example, variations in the type and firing temperature of sinterable glasses, variations in the compositions of the green tape slurry, variations in the composition of the top non-sinterable green tape slurry, and firing history can be employed. The invention is only meant to be limited in accordance with the limitations of the appended claims.

We claim:

1. An article comprising a supported fired ceramic laminate having a plurality of uniformly shaped ceramic posts extending from one surface thereof and a support substrate adhered to the back surface thereof, and a glass panel supported by said posts which provide a uniform spacing between said ceramic laminate and said glass panel.

2. An article according to claim 1 wherein said glass panel is sealed to said ceramic laminate.

* * * * *